US006885022B2

(12) United States Patent
Yaniv et al.

(10) Patent No.: US 6,885,022 B2
(45) Date of Patent: Apr. 26, 2005

(54) LOW WORK FUNCTION MATERIAL

(75) Inventors: Zvi Yaniv, Austin, TX (US); Richard Lee Fink, Austin, TX (US); Igor Pavlovsky, Austin, TX (US)

(73) Assignee: SI Diamond Technology, Inc., Austin, TX (US)

( * ) Notice: Subject to any disclaimer, the term of this patent is extended or adjusted under 35 U.S.C. 154(b) by 26 days.

(21) Appl. No.: 10/005,989

(22) Filed: Dec. 5, 2001

(65) Prior Publication Data

US 2002/0110996 A1 Aug. 15, 2002

Related U.S. Application Data

(60) Provisional application No. 60/254,374, filed on Dec. 8, 2000.

(51) Int. Cl.$^7$ .............................................. H01L 29/06
(52) U.S. Cl. ........................ 257/12; 423/275; 423/414; 257/10
(58) Field of Search ........................................ 257/734

(56) References Cited

U.S. PATENT DOCUMENTS

| | | | |
|---|---|---|---|
| 3,866,077 A | | 2/1975 | Baker et al. |
| 4,272,699 A | | 6/1981 | Faubel et al. |
| 4,728,851 A | | 3/1988 | Lambe |
| 5,457,343 A | * | 10/1995 | Ajayan et al. .............. 257/734 |
| 5,773,921 A | | 6/1998 | Keesmann et al. |
| 5,993,697 A | | 11/1999 | Cohen et al. ................ 252/502 |
| 6,083,624 A | | 7/2000 | Hiura ......................... 428/408 |
| 6,097,138 A | | 8/2000 | Nakamoto |
| 6,139,919 A | * | 10/2000 | Eklund et al. ............ 427/430.1 |
| 6,239,547 B1 | | 5/2001 | Uemura et al. |
| 6,265,466 B1 | | 7/2001 | Glatkowski et al. |
| 6,280,697 B1 | * | 8/2001 | Zhou et al. .................. 423/414 |
| 6,294,142 B1 | * | 9/2001 | Nazri ......................... 423/275 |
| 6,334,939 B1 | * | 1/2002 | Zhou et al. .................. 204/409 |
| 6,359,383 B1 | | 3/2002 | Chuang et al. |
| 6,361,861 B1 | * | 3/2002 | Gao et al. .................... 428/367 |
| 6,380,671 B1 | | 4/2002 | Lee |
| 6,401,526 B1 | * | 6/2002 | Dai et al. ...................... 73/105 |
| 6,454,816 B1 | * | 9/2002 | Lee et al. .................. 29/25.03 |
| 6,471,936 B1 | * | 10/2002 | Chen et al. ............. 423/658.2 |

FOREIGN PATENT DOCUMENTS

| | | |
|---|---|---|
| EP | 0 905 737 A1 | 3/1999 |
| EP | 0 913 508 A2 | 5/1999 |
| EP | 0 951 047 A2 | 10/1999 |
| EP | 1 047 097 A1 | 10/2000 |
| JP | 58-216327 | 2/1994 |
| JP | 10-050240 | 2/1998 |
| JP | 9-221309 | 6/1998 |
| JP | 10-199398 | 7/1998 |
| JP | 11-111161 | 4/1999 |
| JP | 11-135042 | 5/1999 |
| JP | 11-260244 | 9/1999 |
| JP | 11-260249 | 9/1999 |
| JP | 11-297245 | 10/1999 |
| JP | 11-329311 | 11/1999 |
| JP | 11-329312 | 11/1999 |
| JP | 2001-196064 | 7/2001 |
| WO | WO 98/21736 | 5/1998 |

OTHER PUBLICATIONS

A. Wadhawan et al. "Effects of Cs deposition on the field-emission properties of single–walled carbon–nanotube bundles," *Applied Physics Letters*, vol. 78, No. 1, Jan. 1, 2001, pp. 108–110.

\* cited by examiner

*Primary Examiner*—David Nelms
*Assistant Examiner*—Thao P. Le
(74) *Attorney, Agent, or Firm*—Kelly K. Kordzik; Winstead Sechrest & Minick P.C.

(57) ABSTRACT

A cathode includes a carbon nanotube layer, which is optimized with a low work function material, such as an alkali. The inclusion of the alkali material improves the field emission properties of the carbon nanotube layer.

12 Claims, 3 Drawing Sheets

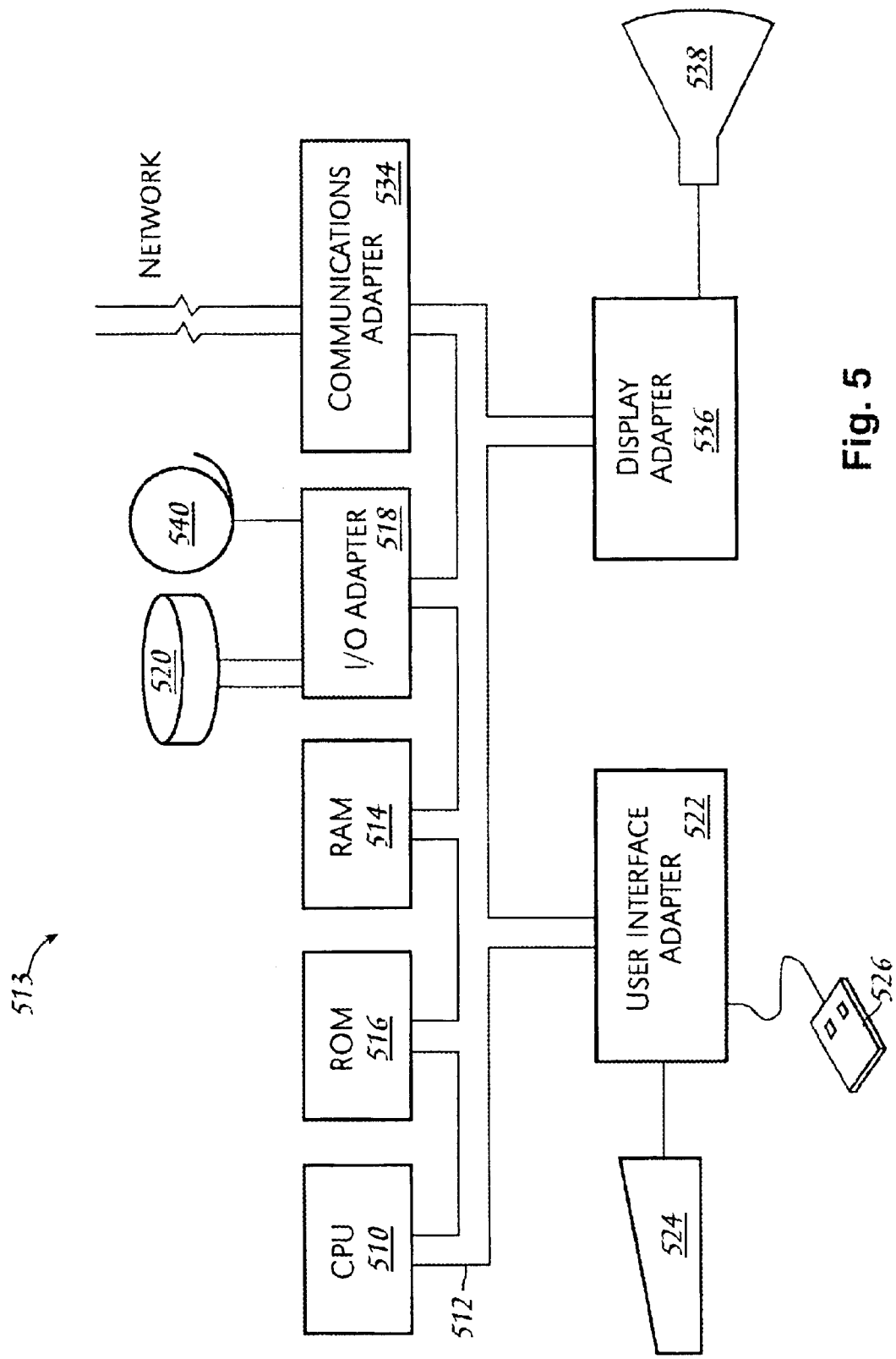

LOW WORK FUNCTION MATERIAL

This application claims priority to U.S. Patent Application Ser. No. 60/254,374, filed on Dec. 8, 2000.

BACKGROUND INFORMATION

Carbon films, including carbon nanotube (CNT) materials, are being developed for cold cathode applications. These applications include field emission displays, x-ray tubes, microwave devices, CRTs, satellite thrusters, or any applications requiring a source of electrons. There are many types of carbon films that are being considered. The emission mechanism believed to be responsible for the emission of electrons from these carbon films is the Fowler-Nordheim theory; this is especially true for the carbon films that are conducting. Included in this emission mechanism is an electrical barrier at the surface of the conductor that prevents electrons from exiting the metal. However, if a strong field is applied, this barrier is lowered or made thin such that electrons can now "tunnel" through the barrier to create a finite emission current. The height of this barrier is partially determined by the work function at the particular surface of the material. The work function is dependent on the material, which surface of the material an attempt to extract electrons is being made, whether or not there are impurities on this surface and how the surface is terminated. What is important is that the lower the work function, the lower the barrier becomes and the easier it is to extract electrons from the carbon film. If a means or treatment is developed that lowers the value of the work function, then it becomes easier to extract electrons from the film; easier in the sense that lower extraction fields are required and higher currents can be obtained from treated films as opposed to untreated films operated at the same extraction field.

In analyzing field emission data, there are four unknowns in the Fowler-Nordheim (F-N) equation. These are n, $\alpha$, $\beta$, and $\Phi$ with n the number of emission sites (e.g., tips), $\alpha$ the emission area per site, $\beta$ the field enhancement factor and $\Phi$ the work function. The F-N equation is given by:

$$I = \alpha A \exp B$$

with $$A = 1.54 \; 10^{-6} \; E^2/\Phi$$

$$B = -6.87 \; 10^7 \; \Phi^{1.5} v/E$$

$$v = 0.95 - y^2$$

and $$y = 3.79 \; 10^{-4} E^{0.5}/\Phi$$

The field at an emission site is $E = \beta E_0$ with $E_0 = V/d$ where V is the extraction voltage and d the cathode-to-anode distance.

To see the effect that work function has on the field emission current, the graph in FIG. 1 shows how lowering the work function from 4.6 eV to 2.4 eV significantly lowers the threshold electric field and allows much higher current densities (orders of magnitude) at a given electrical field.

Single wall carbon nanotubes (SWNTs) and multiwall carbon nanotubes (MWNTs) can be used as carbon materials for field emission applications because they are tall and thin and have sharp features. These sharp features enhance the electric field at these points (large $\beta$), thus a larger field can be achieved with a given applied voltage. Being made of carbon, they are also conductive, mechanically very strong, and chemically robust. The work function of the SWNT material (4.8 eV) is slightly higher than graphite (4.6–4.7 eV), as disclosed in Suzuki et al., APL, Vol. 76, p. 4007, Jun. 26, 2000, which is hereby incorporated by reference herein.

What is needed is a means of optimizing the field emission properties of a carbon material by lowering the work function of this material. This would improve the emission characteristics of the carbon nanotube material, both SWNT and MWNT.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates a data processing system; and

DETAILED DESCRIPTION

One way of lowering the work function of a surface is to deposit alkali metal materials on the surface, or in some cases such as carbon, to interculate or dope the alkali atoms into the structure of the carbon material; for example, Cs (cesium) atoms were demonstrated to lower the work function when they are attached to carbon material. On the other hand, it has been found that the resistance of a SWNT was a non-monotonous function of the Cs uptake. Resistance decreased initially with Cs uptake, goes through a minimum, then increases with further doping and finally saturating.

Furthermore, Cs can also be used to make a negative electron affinity surface of GaAs. In this case, a monolayer of Cs bonded with oxygen on the surface of GaAs leads to an optimum bending of the conduction and valence band at the surface, making a negative electron surface. Increasing the Cs concentration on the surface leads to a metallic surface with increased work function and highly unstable, very chemically reactive.

Figure 1:
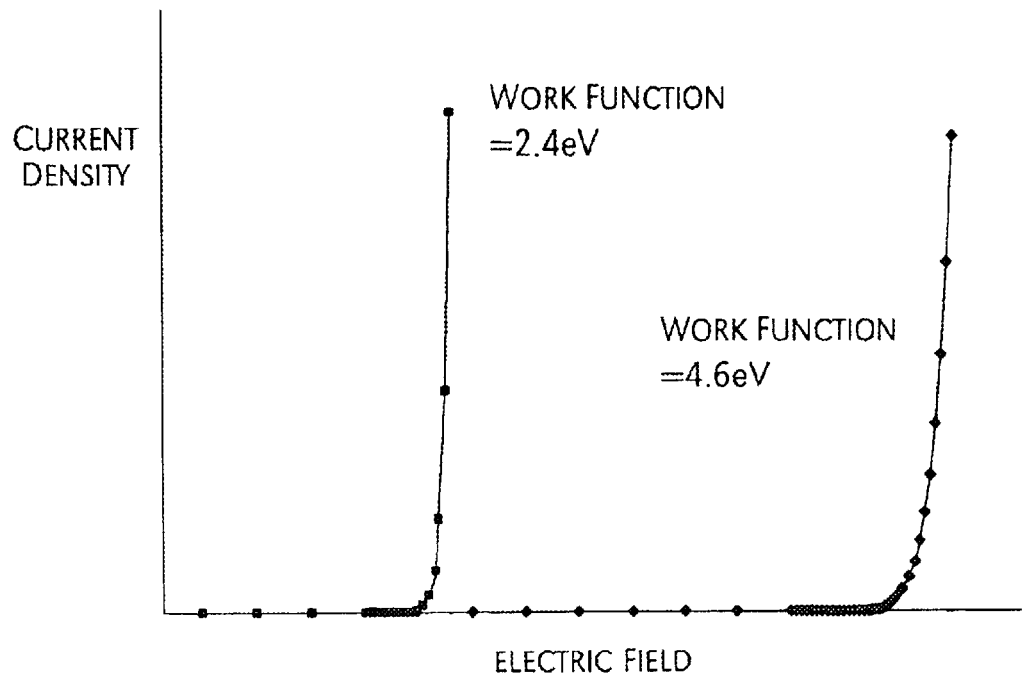
FIG. 1 illustrates a graph of current density versus electric field.
Figure 2:
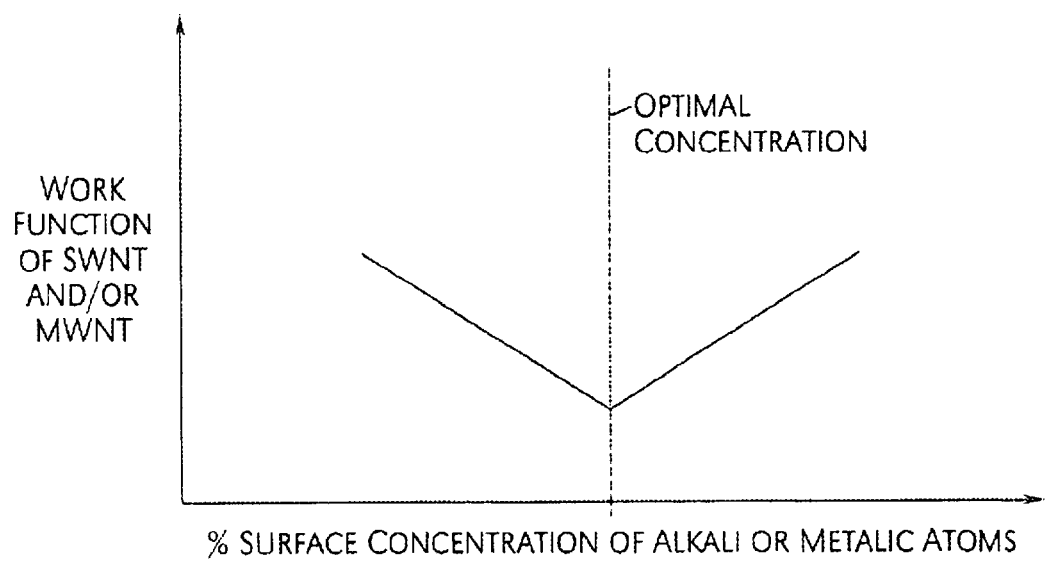
FIG. 2 illustrates a graph of work function versus surface concentration of alkali or metalic atoms.

When this same principle is applied to the SWNT and the MWNT, the work function of the CNT materials is decreased, and this process may be optimized to obtain an optimal situation in the decrease of the work function material (see FIG. 2).

1. Substrate Preparation

The substrate can be considered as a material on which the nanotubes are deposited, and having three constituent parts (layers): substrate base, catalyst, and interface layer in between them.

For many applications, the substrate base is supposed to be a dielectric material withstanding the temperatures on the order of 700 C. (e.g., Corning 1737 F. glass, B3–94 Forsterite ceramic material). It was found that carbon forms on Forsterite substrates in a broader range of deposition conditions, than it does on the glass.

The catalyst is consumed during the deposition of nanotubes (the feature of the CNT formation when carbon grows only on the catalyst interface thus lifting the Ni particle and giving rise to CNT). The roles of the interface layer are (1) to provide feedlines to the emitter and (2) to be a bonding layer between the glass and the catalyst or nanotubes. Ti—W (10%–90) successfully fulfills the two functions. The thickness of the Ti—W coating maybe 2000 Å.

The catalyst materials used were Ni and Fe. In typical deposition conditions for Ni, no carbon is formed on iron catalyst. Ni was likely to have a lower temperature of cracking C—H bonds, though not many experiments have been done with Fe.

The thickness of the Ni catalyst layer is important. If the thickness is too small (<~70 Å), the crystalline structure of the formed carbon is rather amorphous. So also with a thick Ni coating, 200 Å or more. The advantageous value of the thickness lies in the range of 130–170 Å.

2. Deposition Conditions

Carbon is deposited in a gas mixture of ethylene, $C_2H_4$, and hydrogen, with the use of a catalyst. The flow rates of the gases are of the order of a standard liter per minute, and have comparable values. Typical flow rates for $H_2$ are 600 to 1000 sccm, and 700 to 900 sccm for ethylene. The currently used ratio of the gas flows is $H_2:C_2H_4$=600:800 sccm. The gases used for carbon deposition were $H_2$, $C_2H_4$, $NH_3$, $N_2$, He. Ethylene is a carbon precursor. The other gases can be used to dilute ethylene to get carbon growth. The temperature was set to 660–690 C.

Figure 6:
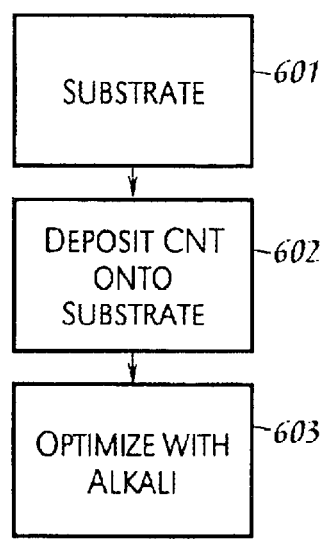
FIG. 6 illustrates a method of making.

3. The Deposition Procedure and Timing (Steps 601–602 in FIG. 6)

1. Loading the sample and air evacuation. This step takes about 3 to 5 minutes, until the pressure gets its base value of 15–20 mTorr.
2. Back fill. This step replaces a He purge stage used to be a first deposition step in small furnace. The gas used for back filling is $H_2$. In a large furnace, it takes 10 minutes to get atmospheric pressure within the tube. The temperature in the tube falls down since the hydrogen effectively transfers heat to the distant parts of the tube that have lower temperature.
3. Push to deposition zone.
4. Preheat. It takes about 15 minutes for the substrate to get the equilibrium temperature inside the tube.
5. Deposition. While hydrogen is on, ethylene is turned on for another 15 minutes to obtain carbon growth.
6. Purge. In fact, purge is a part of the deposition due to slow gas flows along the tube. This step requires ethylene turned off, and lasts 5 minutes with $H_2$ on.
7. Pull to load zone-Evacuate-Vent-Unload.

4. Preparing the Alkali Metal Activation

Figure 3:
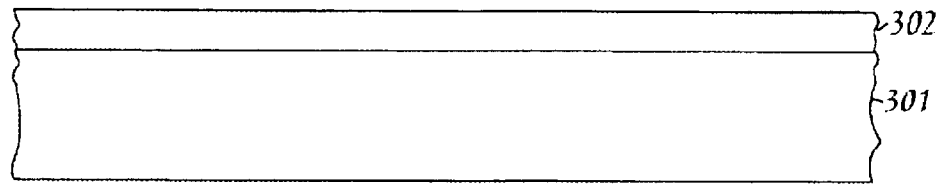
FIG. 3 illustrates an apparatus configured in accordance with the present invention.

Once the carbon (CNT) film is prepared (steps 601–602 in FIG. 6), the sample can be activated by coating it with a layer of alkali metal (step 603). These metals include lithium (Li), sodium (Na), potassium (K), rubidium (Rb), cesium (Cs), and francium (Fr). Cs lowers the work function more than the other alkali metals. This result is an optimized carbon film with alkali material 302 on a substrate 301 (FIG. 3).

The carbon film is placed in a vacuum chamber. A source of Cs is placed with the carbon film such that Cs atoms can be deposited onto the carbon film by evaporation, sputtering, or other physical vapor deposition methods. The thickness of the Cs film is optimized such that the work function of the carbon film is at its lowest.

Another means of coating the carbon film with an alkali metal can be done by depositing a compound of the alkali metal such as a salt (e.g., CsCl), oxide, nitride or similar compound onto the carbon film by physical vapor deposition methods (e.g., evaporation) or by painting, spraying or soaking in a wet solution. This compound can then be decomposed in a plasma or by heat to leave only the Cs metal on the carbon film. The amount of Cs can be controlled by metering the amount of the compound placed on the carbon film or by controlling the means of decomposition.

Another means of activating the carbon film is to put the substrate with the carbon film together with a source of alkali metal in a sealed furnace having a vacuum or inert gas atmosphere (e.g. helium, nitrogen, etc.). The sample and source of Cs is heated to high temperatures under high pressures such that the alkali metal atoms intercalate into the carbon film. Intercalation means that the Cs atoms diffuse into the carbon film but do not replace the carbon atoms in the film, and instead fit into positions between layers of the carbon film. The optimization can be controlled by controlling the alkali metal intercalation parameters.

Another means of activating the carbon film is to dope the carbon film with alkali metal atoms. This means that some of the carbon atoms in the CNT matrix are replaced with atoms of alkali metal. This can be done during the growth of the carbon film or after the film is grown.

The optimization of the alkali metal deposition can be performed by a couple of different ways.

Several samples can be made and tested for optimal performance. Each sample can have a measured amount of material that is different from the other samples. By correlating the results to the amount of coating or activation, the optimal amount can be defined for the type of sample investigated.

Another method is similar to above, except the emission measuring tools are in the same vacuum chamber as the alkali source. In this way, the sample can be measured for emission at the same time the alkali metal is coating the sample. This has the advantage in that the feedback is in real time and exposure to air does not complicate the results. Once the results are known, then the same amount of material can be applied to other samples without having to monitor the results. The results are expected to be reproducible such that they do not have to be monitored for every sample.

Thereafter, the carbon film with alkali material (302) can be used on a cathode for many applications where emitted electrons are useful, including x-ray equipment and display devices, such as in U.S. Pat. No. 5,548,185, which is hereby incorporated by reference.

Figure 4:
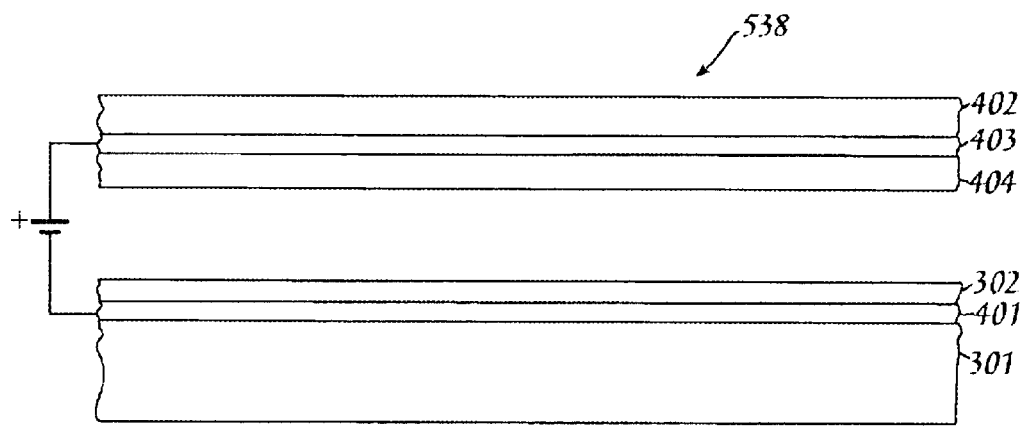
FIG. 4 illustrates a display.

FIG. 4 illustrates a portion of a field emission display 538 made using a cathode, such as created above and illustrated in FIG. 3. Included with the cathode is a conductive layer 401. The anode may be comprised of a glass substrate 402, and indium tin layer 403, and a phosphor layer 404. An electrical field is set up between the anode and the cathode. Such a display 538 could be utilized within a data processing system 513, such as illustrated with respect to FIG. 5.

A representative hardware environment for practicing the present invention is depicted in FIG. 5, which illustrates an exemplary hardware configuration of data processing system 513 in accordance with the subject invention having central processing unit (CPU) 510, such as a conventional microprocessor, and a number of other units interconnected via system bus 512. Data processing system 513 includes random access memory (RAM) 514, read only memory (ROM) 516, and input/output (I/O) adapter 518 for connecting peripheral devices such as disk units 520 and tape drives 540 to bus 512, user interface adapter 522 for connecting keyboard 524, mouse 526, and/or other user interface devices such as a touch screen device (not shown) to bus 512, communication adapter 534 for connecting data processing system 513 to a data processing network, and display adapter 536 for connecting bus 512 to display device 538. CPU 510 may include other circuitry not shown herein, which will include circuitry commonly found within a microprocessor, e.g., execution unit, bus interface unit, arithmetic logic unit, etc. CPU 510 may also reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. An apparatus comprising:
   a substrate; and
   a carbon nanotube layer deposited on the substrate, the carbon nanotube layer including an alkali material, wherein the alkali material is deposited as a layer on the carbon nanotube layer.

2. A field emission apparatus comprising:
   a cathode comprising:
      a substrate; and
      a carbon nanotube layer deposited on the substrate, the carbon nanotube layer including an alkali material, wherein the alkali material is deposited as a layer on the carbon nanotube layer.

3. The apparatus as recited in claim 2, further comprising a conductive layer deposited between the substrate and the carbon nanotube layer.

4. An apparatus comprising:
   a low pressure gaseous environment;
   a substrate; and
   a carbon nanotube layer deposited on the substrate, the carbon nanotube layer including an alkali material.

5. The apparatus as recited in claim 4, wherein the alkali material is deposited as a layer onto the carbon nanotube layer.

6. The apparatus as recited in claim 4, wherein the alkali material is doped into the carbon nanotube layer.

7. The apparatus as recited in claim 4, wherein the alkali material is intercalated with the carbon nanotube layer.

8. A field emission apparatus comprising:
   a cathode comprising:
      a low pressure gaseous environment;
      a substrate; and
      a carbon nanotube layer deposited on the substrate, the carbon nanotube layer including an alkali material.

9. The apparatus as recited in claim 8, wherein the alkali material is deposited as a layer onto the carbon nanotube layer.

10. The apparatus as recited in claim 8, wherein the alkali material is doped into the carbon nanotube layer.

11. The apparatus as recited in claim 8, wherein the alkali material is intercalated with the carbon nanotube layer.

12. The apparatus as recited in claim 8, further comprising a conductive layer deposited between the substrate and the carbon nanotube layer.

* * * * *